(12) United States Patent  
Tsuji (10) Patent No.: US 8,455,837 B2  
(45) Date of Patent: Jun. 4, 2013

(54) ION IMPLANTER, ION IMPLANTATION METHOD AND PROGRAM

(75) Inventor: Yasuyuki Tsuji, Okayama (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 363 days.

(21) Appl. No.: 12/935,781

(22) PCT Filed: Mar. 24, 2009

(86) PCT No.: PCT/JP2009/055796  
§ 371 (c)(1),  
(2), (4) Date: Sep. 30, 2010

(87) PCT Pub. No.: WO2009/122964  
PCT Pub. Date: Oct. 8, 2009

(65) Prior Publication Data  
US 2011/0029117 A1  Feb. 3, 2011

(30) Foreign Application Priority Data  
Mar. 31, 2008 (JP) .............................. JP-2008-093677

(51) Int. Cl.  
*G05B 13/04* (2006.01)  
*G05B 23/02* (2006.01)  
*H01J 1/50* (2006.01)  
*H01J 37/317* (2006.01)

(52) U.S. Cl.  
USPC .............................. 250/396 ML; 250/492.21

(58) Field of Classification Search  
USPC ........... 250/294, 298, 396 R, 396 ML, 492.1, 250/492.2, 492.3, 492.21, 492.22, 492.23  
See application file for complete search history.

(56) References Cited

U.S. PATENT DOCUMENTS  
6,858,854 B2 *  2/2005  Keum et al. .............. 250/492.21  
(Continued)

FOREIGN PATENT DOCUMENTS  
JP  2878112  1/1999  
JP  3730666  10/2005  
(Continued)

*Primary Examiner* — Bernard E Souw  
(74) *Attorney, Agent, or Firm* — Muncy, Geissler, Olds & Lowe, PLLC (57) ABSTRACT

The ion implanter includes lens elements that arrange unit lens elements along a direction of a beam width of a ribbon ion beam and regulate a magnetic field or electric field to be created by each unit lens element in order to regulate a current density distribution of the ion beam, and a controlling portion that sets the intensity of the magnetic field or electric field to be created by the unit lens element to be regulated by the lens elements in accordance with the measured current density distribution. The regulation intensity of the magnetic field or electric field to be created by the unit lens element that corresponds to a position to be regulated in the unit lens elements of the lens elements is determined from the measured current density distribution and a value obtained by multiplying the determined regulation intensity by a fixed ratio is determined as the regulation intensity of the magnetic field or electric field for the magnetic field or electric field to be created by a unit lens element adjacent to the unit lens element.

7 Claims, 7 Drawing Sheets

U.S. PATENT DOCUMENTS

| | | | |
|---|---|---|---|
| 7,326,941 B2 * | 2/2008 | Chen et al. | 250/492.21 |
| 7,718,978 B2 * | 5/2010 | Yamashita | 250/423 R |
| 8,035,087 B2 * | 10/2011 | White | 250/396 ML |
| 2003/0197132 A1 * | 10/2003 | Keum et al. | 250/492.21 |
| 2006/0113494 A1 * | 6/2006 | Chen et al. | 250/492.21 |
| 2006/0169924 A1 * | 8/2006 | Purser et al. | 250/492.21 |
| 2009/0001290 A1 * | 1/2009 | Yamashita | 250/492.3 |
| 2009/0272918 A1 * | 11/2009 | Satoh | 250/492.21 |
| 2010/0001204 A1 * | 1/2010 | White | 250/398 |

FOREIGN PATENT DOCUMENTS

| | | |
|---|---|---|
| JP | 2005-327713 | 11/2005 |
| JP | 2006-4676 A | 1/2006 |
| JP | 2007-273368 | 10/2007 |
| WO | 98/02900 | 1/1998 |

* cited by examiner

ION IMPLANTER, ION IMPLANTATION METHOD AND PROGRAM

TECHNICAL FIELD

The present invention relates to an ion implanter and an ion implantation method that irradiate a ribbon ion beam onto a target substrate to be processed, a computer-executable program for regulating a current density distribution of the ribbon ion beam, and a computer-readable recording medium on which this program is coded.

BACKGROUND ART

Today, glass substrates and semiconductor substrates used in flat-screen display devices that employ liquid crystal or organic LEDs are widely subjected to processing in which ion implantation is performed using an ion implanter. Particularly, efficient and accurate ion implantation on a large-sized substrate requires a wide lateral width of the ion beam irradiated on the lateral width of the substrate and use of a ribbon ion beam in which the current density distribution is controlled to a desire distribution.

Using a ribbon ion beam having an ion beam lateral width that is wider than the substrate lateral width makes it possible to process the entire lateral width region of the substrate at once and, by moving the substrate in the vertical direction at this time, perform ion implantation on the entire substrate at once, thereby increasing processing efficiency.

On the other hand, a ribbon ion beam processes the same position of the substrate in the lateral width direction as in the vertical direction and thus when the current density distribution of this ribbon ion beam is not uniform in the lateral width direction, sections in which ion implantation was unevenly performed appear as lines on the substrate, resulting in failure to achieve accurate ion implantation. In consequence, it is desirable to accurately regulate the ribbon ion beam to a desired current density distribution.

In JP 2878112 B there is described an ion implanter that causes a multipolar magnetic field to act on a ribbon ion beam having a shape in which the cross-sectional shape of the ion beam has length and width dimensionality in the transverse direction, thereby suppressing the unevenness of the current density distribution of the ribbon ion beam.

Similarly, in JP 3730666 B there is described an ion implanter that, similar to JP 2878112 B, causes a multipolar magnetic field to act on the current density distribution of a ribbon ion beam, thereby regulating the current density distribution. The document states that, at this time, regulation of the current density distribution is performed based on the deviation between the ribbon ion beam distribution and the target distribution.

Furthermore, in JP 2005-327713 A there is described an ion implanter such as the following. That is, in the ion implanter, a sheet-shaped ion beam that includes a desired ion type and has a width wider than the width of the short side of the substrate is generated from an ion source, the sheet-shaped ion beam is then curved in a direction orthogonal to the sheet plane by a mass separation magnet, and the desired ion type is selectively extracted. At this time, a separation slit is used in coordination with the mass separation magnet to selectively permit the passing of the desired ion type. Subsequently, the substrate is moved back and forth in a direction substantially orthogonal to the sheet plane of the ion beam, within the irradiation range of the ion beam that has passed through the separation slit, to perform ion implantation.

PATENT DOCUMENT 1: JP 2878112 B
PATENT DOCUMENT 2: JP 3730666 B
PATENT DOCUMENT 3: JP 2005-327713 A

DISCLOSURE OF THE INVENTION

Problems to be Solved by the Invention

None of the above-described patent documents JP 2878112 B, JP 3730666 B, or JP 2005-327713 A, however, includes a detailed description of ion beam regulation, more specifically, the setting method used to set the magnetic field or electric field used for regulating the ion beam from the measured current density distribution.

To optimally set the intensity of the magnetic field or electric field to be controlled so that the measured current density distribution is best approximated to the target distribution, optimization methods that use a neural network and a genetic algorithm can be used. In such methods, however, the computer processing takes time and the processing details are complex. Furthermore, deterioration in robustness occurs, that is, the optimum intensity of the magnetic field or electric field changes greatly in response to a slight change in current density distribution.

It is therefore an object of the present invention to solve the above-described problems and provide an ion implanter and an ion implantation method capable of efficiently regulating the current density distribution of a ribbon ion beam so that a target distribution is accurately achieved, a computer-executable program for regulating the current density distribution of the ribbon ion beam, and a computer-readable recording medium on which this program is coded.

Means to Solve the Problems

In order to achieve the above object, the present invention provides an ion implanter that irradiates on a target substrate to be processed a ribbon ion beam having a beam width that is wider than a lateral width of the target substrate to be processed and performs ion implantation on the target substrate to be processed, comprising: a beam shaping portion that comprises an ion source that generates an ion beam and shapes the generated ion beam into the ribbon ion beam; a processing portion that irradiates the ribbon ion beam onto the target substrate to be processed; a beam regulating portion that, in order to regulate a current density distribution of the ribbon ion beam in which a total value of current densities in a direction of the beam thickness of the ribbon ion beam is represented by a distribution in a direction of the beam width, arranges unit lens elements along the direction of the beam width of the ribbon ion beam, and regulates and sets an intensity of a magnetic field or electric field to be created by each unit lens element; and a beam controlling portion comprising a measuring portion that measures the current density distribution of the ribbon ion beam regulated by the beam regulating portion, and a setting portion that resets the intensity of the magnetic field or electric field by determining a regulation intensity of the magnetic field or electric field to be created by the unit lens element to be regulated by the beam regulating portion in accordance with the measurement results, and adding the regulation intensity thus determined to the intensity of the magnetic field or electric field presently set in the beam regulating portion, wherein the setting portion determines the regulation intensity of the magnetic field or electric field to be created by a corresponding unit lens element of the unit lens elements that corresponds to a position where the current density distribution thus measured is to be regulated from the current density distribution measured by the measuring portion, determines for the magnetic field or electric field to be created by a unit lens element adjacent to the corresponding unit lens element a value obtained by multiplying the regulation intensity thus determined by a fixed ratio as the regulation intensity of the magnetic field or electric field, and resets the intensity of the magnetic field or electric field using the regulation intensity thus determined.

Preferably, the beam regulating portion regulates the electric field to be created by the unit lens element, the position where the current density distribution is to be regulated is a position where a difference between the measured current density distribution and a predetermined distribution is largest, and the fixed ratio is 1 or less; and the beam regulating portion determines the value obtained by multiplying the regulation intensity of the electric field of the corresponding unit lens element thus set by the fixed ratio as the regulation intensity of the electric field for the unit lens element adjacent to the corresponding unit lens element corresponding to the position where the difference is largest.

Preferably, the beam regulating portion regulates the magnetic field to be created by the unit lens element, the position where the current density distribution is to be regulated is a position where a gradient of difference is largest in a distribution of differences between the measured current density distribution and a predetermined distribution, and the fixed ratio is 1 or less; and the beam regulating portion determines the value obtained by multiplying the regulation intensity of the magnetic field of the corresponding unit lens element thus set by the fixed ratio as the regulation intensity of the magnetic field for the unit lens element adjacent to the corresponding unit lens element corresponding to the position where the gradient is largest.

The gradient as used herein refers to an absolute value (magnitude) of the inclination in the current density distribution. Whether the inclination is made on the left side or right side, or on the positive side or negative side is not taken into account.

The fixed ratio preferably ranges from 0.3 to 0.6.

The present invention also provides an ion implantation method that uses an ion implanter that irradiates on a target substrate to be processed a ribbon ion beam having a beam width that is wider than a lateral width of this target substrate to be processed and performs ion implantation on the target substrate to be processed, wherein the ion implanter, in order to regulate a current density distribution of the ribbon ion beam in which a total value of current densities in a direction of the beam thickness of the ribbon ion beam is represented by a distribution in a direction of the beam width, comprises means for arranging unit lens elements along the direction of the beam width of the ribbon ion beam and regulating and setting an intensity of a magnetic field or electric field to be created by each unit lens element, the ion implantation method comprising the steps of:

when the ion beam is to be irradiated on the target substrate to be processed to perform the ion implantation, measuring the current density distribution of the ion beam regulated by the magnetic field or electric field of each of the unit lens elements;

resetting the intensity of the magnetic field or electric field by determining a corresponding unit lens element of the unit lens elements that corresponds to a position where the current density distribution thus measured is to be regulated, determining a regulation intensity of the magnetic field or electric field to be created by the corresponding unit lens element from the current density distribution thus measured, determining, as the regulation intensity of the magnetic field or electric field, a value obtained by multiplying the intensity thus set by a fixed ratio for the magnetic field or electric field to be created by the unit lens element adjacent to the corresponding lens, and adding the regulation intensity thus determined to the intensity of the magnetic field or electric field presently set in each of the unit lens elements; and applying the reset intensity to the electric field or magnetic field of the unit lens elements to regulate the current density distribution of the ribbon ion beam.

The present invention further provides a computer-executable program which sets an intensity of a magnetic field or electric field in an ion implanter that irradiates on a target substrate to be processed a ribbon ion beam having a beam width that is wider than a lateral width of the target substrate to be processed and performs ion implantation on the target substrate to be processed, in order to cause the magnetic field or electric field to act on the ribbon ion beam and regulate a current density distribution of the ribbon ion beam, as well as a computer-readable recording medium on which the program is coded and stored. In order to regulate the current density distribution of the ribbon ion beam in which a total value of current densities in a direction of the beam thickness of the ribbon ion beam is represented by a distribution in a direction of the beam width, the ion implanter comprises means for arranging unit lens elements along the direction of the beam width of the ribbon ion beam and regulating and setting the intensity of the magnetic field or electric field to be created by each unit lens element.

The program includes the procedures of:

when the ion beam regulated by the magnetic field or electric field of each of the unit lens elements is irradiated on the target substrate to be processed to perform the ion implantation, calculating the current density distribution of the ion beam from measured data of the current density in computing means of a computer, and storing the calculated current density distribution of the ion beam in storing means of the computer;

determining in the computing means a corresponding unit lens element of the unit lens elements that corresponds to a position where the current density distribution thus calculated is to be regulated, calculating in the computing means a regulation intensity of the magnetic field or electric field to be created by the corresponding unit lens element from the current density distribution thus measured, calculating in the computing means for the magnetic field or electric field to be created by a unit lens element adjacent to the corresponding lens a value obtained by multiplying the regulation intensity thus calculated by a fixed ratio as the regulation intensity of the magnetic field or electric field, and resetting in the computing means a sum of these regulated intensities thus calculated and the intensity of the magnetic field or electric field presently set in each of the unit lens elements as the intensity of the magnetic field or electric field; and creating in the computing means a control signal that applies the reset intensity to the electric field or magnetic field of the unit lens elements to regulate the current density distribution of the ribbon ion beam.

The present invention further provides a computer-executable program which sets an intensity of a magnetic field or electric field in an ion implanter that irradiates on a target substrate to be processed a ribbon ion beam having a beam width that is wider than a lateral width of the target substrate to be processed and performs ion implantation on the target substrate to be processed, in order to cause the magnetic field or electric field to act on the ribbon ion beam and regulate a current density distribution of the ribbon ion beam, as well as a computer-readable recording medium on which the program is coded and stored.

In order to regulate the current density distribution of the ribbon ion beam in which a total value of current densities in a direction of the beam thickness of the ribbon ion beam is represented by a distribution in a direction of the beam width, the ion implanter comprises means for arranging unit lens elements along the direction of the beam width of the ribbon ion beam and regulating and setting the intensity of the magnetic field or electric field to be created by each unit lens element.

The program includes the procedures of:

when the ion beam regulated by a magnetic field or electric field of each of the unit lens elements is irradiated on the target substrate to be processed to perform the ion implantation, calculating the current density distribution of the ion beam from measured data of the current density in computing means of a computer, and storing the calculated current density distribution of the ion beam in storing means of the computer;

determining in the computing means a corresponding unit lens element of the unit lens elements that corresponds to a position where the current density distribution thus calculated is to be regulated, calculating in the computing means a regulation intensity of the magnetic field or electric field to be created by the corresponding unit lens element from the current density distribution thus measured, calculating in the computing means for the magnetic field or electric field to be created by a unit lens element adjacent to the corresponding unit lens a value obtained by multiplying the regulation intensity thus calculated by a fixed ratio as a regulation intensity of the magnetic field or electric field, and resetting in the computing means a sum of these regulated intensities thus calculated and the intensity of the magnetic field or electric field presently set in each of the unit lens elements as the intensity of the magnetic field or electric field;

calculating by simulation in the computing means the current density distribution of the ion beam regulated using the reset intensity;

repeatedly resetting the intensity of the magnetic field or electric field and performing the simulation in the computing means until the current density distribution obtained by the simulation substantially matches the target distribution; and creating in the computing means a control signal that applies the intensity when the current density distribution obtained from the simulation substantially matches the target distribution to the electric field or magnetic field of the unit lens elements to regulate the current density distribution of the ribbon ion beam.

Effects of the Invention

The ion implanter, implantation method, and program of the present invention determine from a measured current density distribution a regulation intensity of a magnetic field or an electric field to be created by a corresponding unit lens element of a plurality of unit lens elements that corresponds to a position where the current density distribution is to be regulated, and determine for a magnetic field or an electric field to be created by a unit lens element adjacent to the above corresponding unit lens element a value obtained by multiplying the regulation intensity determined with the corresponding unit lens element by a fixed ratio as the regulation intensity of the magnetic field or electric field. As a result, compared to a case where a prior art optimization method of a neural network, genetic algorithm, or the like is used, the amount of time required to determine the regulation intensity is abbreviated and the processing details are simple, making it possible to efficiently regulate the current density distribution so that a target distribution is accurately achieved. Moreover, the ion implanter, implantation method, and program of the present invention determine the regulation intensity of each magnetic field or each electric field by multiplying the regulation intensity of the magnetic field or electric field to be created by the corresponding unit lens element by a fixed ratio, and then sets the intensity of the magnetic field or electric field, thereby achieving good robustness.

DESCRIPTION OF SYMBOLS

10 ION IMPLANTER
20 BEAM SHAPING PORTION
22, 22a, 22b, 22c ION SOURCE
24, 24a, 24b, 24c ION BEAM
25a, 25b, 25c, 25d EDGE
30 BEAM TRANSPORTING PORTION
32 MASS SEPARATION MAGNET
34 YOKE
36 MAGNETIC POLE
37 MAGNETIC POLE END FACE
38 COIL
40, 90 LENS ELEMENT
42 YOKE
44 ELECTROMAGNET
46 MAGNETIC POLE
48 COIL
49, 52 CONVERGENCE POSITION
50 SEPARATION SLIT
54 FLANGE
60 PROCESSING PORTION
62 PROCESSED SUBSTRATE
64 FARADAY CUP
80 CONTROL PORTION
82 MEASUREMENT MODULE
84 CONTROL MODULE
85 MEMORY

86 CPU
87 I/O
88 POWER SUPPLY DRIVING PORTION
91 ELECTRODE
92 TERMINAL
93 INSULATED TERMINAL
94 SUPPORT
95a, 95b SHIELD ELECTRODE
110 VACUUM HOUSING

BEST MODE FOR CARRYING OUT THE INVENTION

The following describes in detail the ion implanter of the present invention based on the preferred embodiments illustrated in the accompanying drawings.

Figure 1:
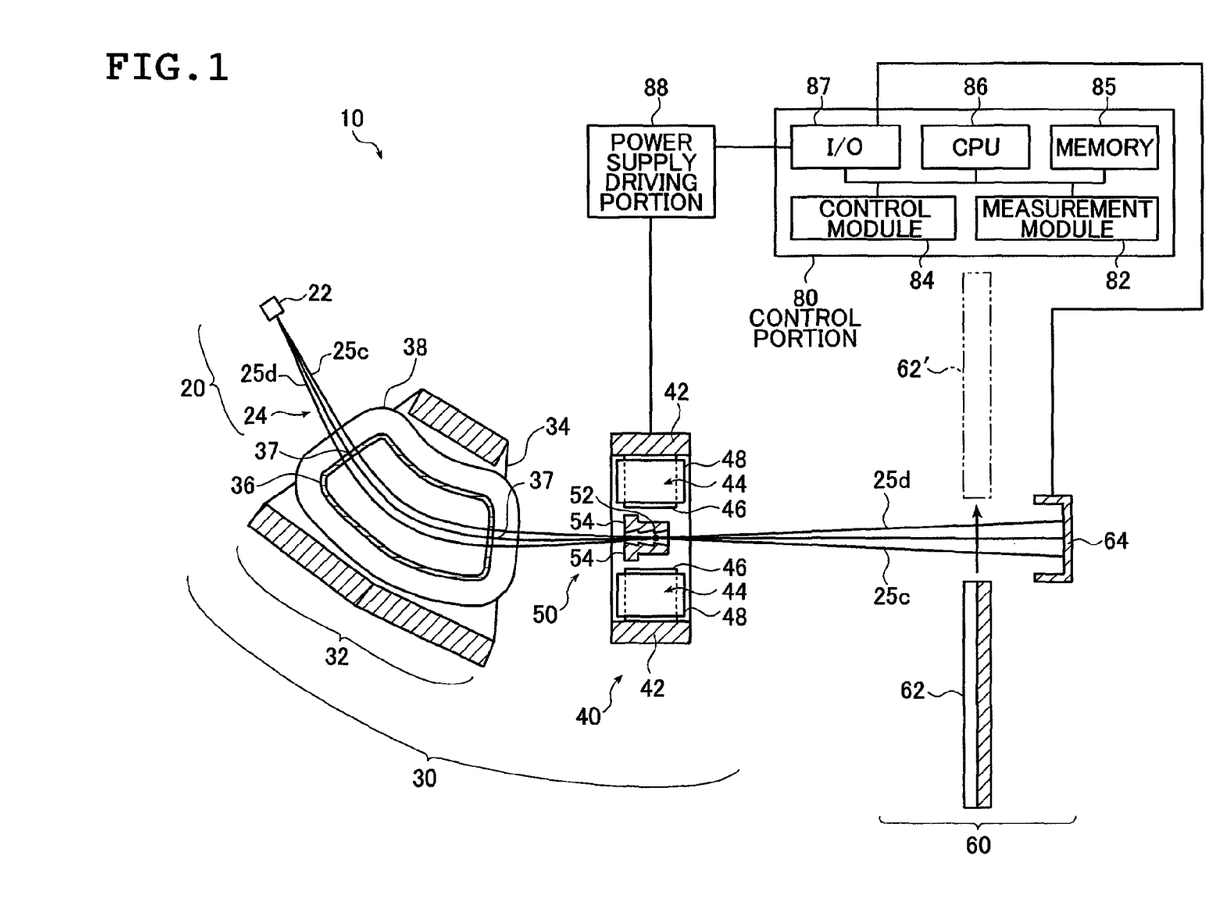
FIG. 1 is a schematic plan view illustrating the configuration of an embodiment of the ion implanter of the present invention.
Figure 2:
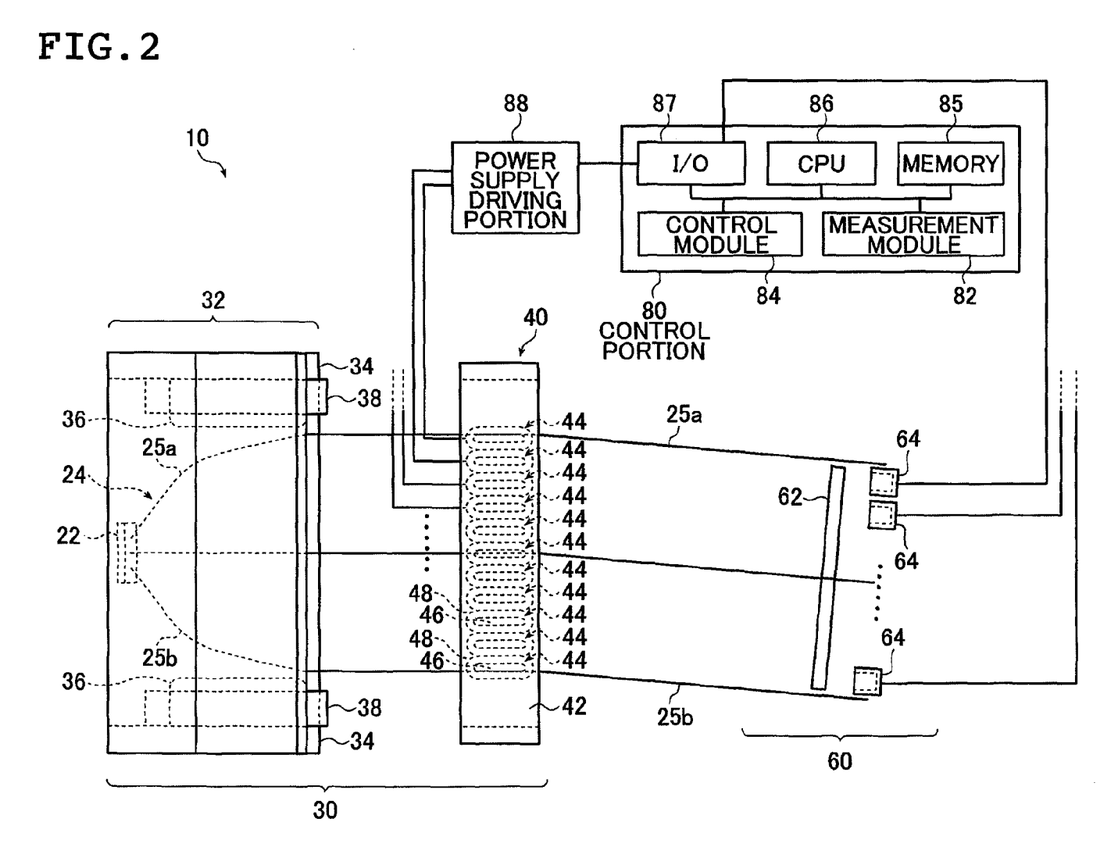
FIG. 2 is a schematic side view of the ion implanter illustrated in FIG. 1.

FIG. 1 is a plan view of an ion implanter 10, which is an embodiment of the ion implanter of the present invention. FIG. 2 is a side view of the ion implanter 10.

The ion implanter 10 comprises a beam shaping portion 20 that comprises an ion source; a beam transporting portion 30 that comprises a mass separation magnet and a lens element, which serves as the beam regulating portion; a processing portion 60 that performs ion implantation on a target substrate to be processed (hereinafter "processed substrate"); and a control portion 80, in that order from the upstream side of the ion beam. The beam shaping portion 20, the beam transporting portion 30, and the processing portion 60 are surrounded by a vacuum housing (not shown) where a uniform vacuum level ($10^{-3}$ to $10^{-5}$ Pa) is maintained by a vacuum pump.

In the present invention, the ion source side is referred to as the upstream side and the processed substrate side is referred to as the downstream side, based on the flow of the ion beam that travels from the ion source toward the processed substrate.

The beam shaping portion 20 comprises a small-sized ion source 22. The ion source 22 is a section that generates an ion beam. A Burnus type or Freeman type plasma generator is used to draw the ion beam from the small-sized ion source 22 so that the ion beam scatters. The Burnus type ion source comprises a filament and reflectors inside a metal chamber, and magnets on the outside thereof. Gas that contains atoms used for ion implantation is supplied inside the metal chamber of the ion source 22, with the metal chamber being in a vacuum state, and current is introduced to the filament to release and bounce thermal electrons back and forth between the reflectors provided on both sides of the metal chamber. In this state, an arc discharge is generated by applying a predetermined arc voltage to the metal chamber, thereby disassociating the gas supplied inside the metal chamber and generating plasma. This generated plasma is then withdrawn from an extraction hole provided on the side wall of the metal chamber using extraction electrodes, causing an ion beam 24 to be emitted from the metal chamber.

The ion source 22 of this embodiment employs a small-sized ion source to generate a scattered ion beam. In the present invention, however, the configuration may be designed so that substantially parallel ribbon ion beams having a substantially uniform beam width are generated from a large-sized ion source rather than a small-sized ion source. Additionally, a plurality of ion sources may be used to generate the ion beams.

The current density of the generated ion beam 24 continually changes according to position, from regions of low current density near the edges of the ion beam to a region of high current density, which is the main region of the ion beam, and thus the boundaries therebetween have been unclear to date. However, according to the present invention, the line of the ion beam 24 is determined by defining a section where the current density near the edge of the ion beam exceeds a predetermined value as an ion beam edge.

The ion beam generated from the ion source 22 scatters at edges 25a and 25b of the ion beam as illustrated in FIG. 2 and, at the same time, scatters at edges 25c and 25d of the ion beam as illustrated in FIG. 1, with the level of scattering at the edges 25c and 25d of the ion beam being lower. Such a difference in the level of scattering of the ion beam can be determined by the shape of the extraction hole of the ion source 22 and the configuration of the extraction electrodes.

The cross-sectional shape of the ion beam thus generated forms a shape wherein the beam thickness, which is the thickness between the edges 25c and 25d of the ion beam, is thinner than the beam width, which is the length between the edges 25a and 25b of the ion beam, i.e. a ribbon shape. The beam width of this ion beam is shaped so that the beam width is wider than the lateral width of the processed substrate.

Note that an ion beam is a flow of particles having a positive charge and, as illustrated in FIG. 1, the edges 25c and 25d of the ribbon ion beam that reach a processing portion 60 represent scattering by the action of a repulsive force caused by the charge of the ion beam. However, in the present invention, whether the ion beam is one that scatters in such a manner or converges, the ion beam is applicable to the present invention.

The ion beam 24 generated by the ion source 22 becomes ribbon in shape and travels to the beam transporting portion 30.

The beam transporting portion 30 comprises a mass separation magnet 32, a lens element 40, and a separation slit 50. The beam transporting portion 30 is designed to thin out the thickness of the ion beam 24 in the beam thickness direction (in the thickness direction between the edges 25c and 25d in FIG. 1), converge the ion beam, and then irradiate the ion beam 24 onto the processed substrate 62 of the processing portion 60.

The mass separation magnet 32 is an electromagnet designed so that a pair of magnetic poles 36 is provided in an opposing manner to the inside of a rectangular tube structure formed by a yoke 34, with a coil 38 wrapped around the periphery of the magnetic pole 36. The coil 38 is connected in series and connected to a power source (not shown) for current supply so that the magnetic field created by the pair of magnetic poles 36 is formed in the same direction.

The ion beam 24, as understood from the trajectory of the edges 25c and 25d illustrated in FIG. 1, forms the ion beam 24 that slightly scatters, and then enters the mass magnet 32. This ion beam 24 passes between the pair of magnetic poles 36, where the travel direction of the ion beam 24 is curved so that curvature exists in the thickness direction of the ribbon ion beam, and where the ion beam 24 is shaped so that it converges at the position of the separation slit described later.

The surface that faces the inside of the pair of magnetic poles 36 is partially sloped or the sloping position is changed and adjusted to form a surface of continuous cylindrical surfaces of different curvatures, or a complex continual curved surface such as a torus surface or the like. Or, the configuration is designed so that a part of the magnetic poles 36 is operated, and the angle at which each magnetic pole end face 37 is formed on both sides with respect to the ion beam 24 is adjusted. Note that a field clamp that extends from the yoke 34 to beyond the coil 34 on the side of the ion beam 24 may be provided to the mass separation magnet 32. Or, the configuration may be designed so that the shape of the coil 38 is adjusted to form a desired ion beam shape.

Under the influence of the plasma density of the ion source 22, the extraction electrodes (not shown), and the magnetic field of the mass separation magnet 32, the ion beam 24 that has passed through the mass separation magnet 32 is suppressed to a current density of certain level or less, such as 5% or less, for example, by regulating the plasma density, the voltage of the extraction electrodes, and the magnetic field of the mass separation magnet 32. This variance in current density of the ion beam 24 is decreased to about 1% by the lens element 40 described later.

Here, the current density of the ion beam refers to the integrated value, i.e., the total sum, of the current densities along the thickness direction of the ion beam 24, i.e., the direction between the edges 25c and 25d of the ion beam. The variance in current density refers to the level of standard deviation of the difference deviation by which the current density distribution, which is the distribution in the beam width direction of the current densities (the length direction between the edges 25a and 25b in FIG. 2), deviates from the target distribution (a uniform distribution, for example). More specifically, a variance of 1% or less refers to a ratio of the standard deviation of the difference deviation to the average current density value that is equivalent to 1% or less.

Note that, in the present invention, the desired current density distribution may be a non-uniform distribution rather than a uniform distribution. For example, to intentionally change the ion dose according to location in accordance with the non-uniformity of heat treatment or the non-uniformity of a thin film formed by a method such as CVD on a processed substrate 62, the current density distribution is sometimes regulated to a target non-uniform distribution.

The lens element 40 is a beam regulating portion that bends a section of the ribbon ion beam 24 in the direction of the beam width within the plane of the ribbon ion beam 24, and regulates the current density distribution in the beam width direction of the ion beam 24. The lens element 40 is disposed in a region near a convergence position 52 of the ion beam, where the thickness of the ion beam 24 is thin compared to the thickness of the ion beam 24 that passes through the mass separation magnet 32, and regulates the current density distribution of the ion beam 24 in this region. Note that while the lens element 40 is disposed in a region near the convergence position 52 of the ion beam in this embodiment, the present invention does not necessarily require disposition in the region near the convergence position 52.

The lens element 40 forms a pair of electromagnets 44 on the yoke 42 on both sides of the ion beam 24, and lines such a pair in series in the beam width direction of the ion beam 24, thereby providing a plurality of unit lens elements. Each of the electromagnets 44 of the unit lens element is provided to a position that is symmetrical with respect to the other side, with the center plane of the ion beam 24 in the beam thickness direction serving as the center. That is, the magnetic field to be created by the electromagnets 44 is symmetrically distributed with respect to the center plane of the ion beam 24. The electromagnet 44 comprises a magnetic pole 46 made of soft magnetic iron, and a coil 48 wrapped around the periphery of the magnetic pole 46. The wire of the coil 48 is connected in series with respect to the pair of electromagnets 44 so that the magnetic field to be created by one of the electromagnets 44 that form a pair is oriented toward the other electromagnet 44. In this manner, a plurality of sets of the electromagnets 44 that form an opposing pair are provided on the yoke 42 so that the pairs extend across the entire beam width, thereby forming a plurality of sets of unit lens elements. The number of unit lens elements is about 10 to 20.

Note that the lens element 40 shown in FIG. 1 and FIG. 2 is merely an example, and the present invention is not limited thereto. The ion beam 24 is regulated to a certain degree so that the current density distribution approaches a predetermined distribution via the ion source 22, the extraction electrodes (not shown) of the ion source 22, and the mass separation magnet 32, thereby permitting modest regulation by the lens element 40. As a result, generation of the magnetic field by the lens element 40 may be modest as well.

Further, in addition to regulation of the ion beam 24 using a magnetic field, the lens element 40 is also capable of regulating the ion beam 24 using an electric field such as described later. However, the lens element 40 preferably uses a magnetic field based on the following. That is, the electrons that surround the ion beam 24 like a cloud and move at low speeds with a lack of uniformity inhibit properties that cause the ion beam 24 itself to scatter due to the repulsive force between positive charges within the ion beam 24; since a magnetic field does not greatly affect these electrons, the lens element 40 preferably uses a magnetic field.

The separation slit 50 is provided between the electromagnets 44 that form a pair in the lens element 40. The separation slit 50, although not shown in FIG. 2, comprises a non-magnetic material member wherein a long, thin hole (slit) is provided that extends across the edges 25a and 25b of the ion beam 24. The ion beam 24 bent in the mass separation magnet 32 converges at the convergence position 52 in the beam thickness direction on the downstream side of the mass separation magnet 32, and the separation slit 50 is provided at this convergence position 52, allowing only ion particles having a predetermined mass and charge to pass. That is, the separation slit 50 is provided at the convergence position 52 where the ion beam 24 converges in the beam thickness direction, and the lens element 40 is provided at a position that overlaps with the separation slit 50.

Within the ion beam 24, the ion particles that do not have a predetermined mass and load, do not converge at the convergence position and therefore collide on the wall surface of the separation slit 50, hindering movement to the downstream side. As a result, the separation slit 50 requires use of a raw material having resistance to wear and tear caused by the collision of ion particles, with graphite, for example, preferably used. The collision of ion particles causes severe wear and tear when it occurs on the wall surface at an incline from the perpendicular, and thus the separation slit 50 preferably comprises a shape by which the ion particles collide with the wall surface substantially perpendicularly.

In the separation slit 50, when the ion particles collide, a portion of the material of the separation slit 50 receives the impact energy of the ion particles and physically scatters as particles, causing the formation and scattering of a gas by vaporization from the heat. At this time, the beam transporting portion 30 is in a low-pressure atmosphere, resulting in the concern that the above-described scattering will spread in a linear fashion. Thus, the form of the separation slit 50 needs to be determined in such a manner that the section where the ion particles collide is not visible from the processed substrate in order to ensure that the material components of the scattered particles, gas, and the like, do not reach the processed substrate on the downstream side. For example, as illustrated in FIG. 1, a flange 54 having a collision surface with a wide surface area is provided to the section where the ion particles collide on the upstream side of the separation slit 50, thereby hindering the arrival of the scattered material components at the processed substrate.

The separation slit 50 needs to be a non-magnetic body so that there is no effect on the magnetic field to be created by the lens element 40. Furthermore, the separation slit 50 may be disposed so that it is adjacent to rather than overlaps with the lens element 40.

In a case where the lens element 90 that regulates the ion beam 24 using an electric field is used in place of the lens element 40, as described later, the lens element 90 is preferably disposed adjacent to the separation slit 50 taking into consideration the difficulties in selecting a material that does not affect the electric field and the effects on the electric field when a conductive film is deposited on the front surface of the separation slit 50. In such a case, the separation slit 50 needs to be disposed at the convergence position 52 of the ion beam 24, and therefore the lens element 90 is disposed so that it is adjacent to the separation slit 50.

Furthermore, the opening width of the slit of the separation slit 50 in the thickness direction of the ion beam 24 may be fixed, but is preferably variably adjustable. An adjustable opening width makes it possible to adjust the opening width of the slit in accordance with the dose of ions to be implanted into the processed substrate or in accordance with the necessity of implantation of ions with high purity, thereby making it possible to appropriately adjust the ion particle separation performance. Further, while there are cases where the thickness of the ion beam 24 at the convergence position 52 is around tens of millimeters, the trajectory of the ion beam 24 is not always uniform due to the effects of the type of ions, the energy of the ion beam, and the charge of the ion particles. Thus, the opening width of the slit is preferably adjustable in accordance with circumstance.

The ion beam 24 comprising only predetermined ion particles after separation of the unnecessary ion particles at the separation slit 50 and regulated to a current density distribution at the lens element 40 travels to the processing portion 60 while expanding in beam thickness.

The processing portion 60 comprises a moving mechanism (not shown) that performs ion implantation while transporting the processed substrate 62 from the downstream side to the upstream side in FIG. 1, and a Faraday cup 64 that measures the current density distribution of the ion beam 24.

The processed substrate 62 is exemplified by a semiconductor wafer or a glass substrate. The beam width of the ion beam 24 is wider than the lateral width of the processed substrate 62 as shown in FIG. 2 due to the adjustments made by the mass separation magnet 32.

Additionally, the ion beam 24 irradiated on the processed substrate 62 inclines downward in the figure so that its position lowers as it travels toward the processed substrate 62 on the downstream side, as illustrated in FIG. 2. This is because a base (not shown) uses gravity to hold the processed substrate 62 from the rear surface of the processed substrate 62 and the ion beam 24 is injected perpendicular to the processed substrate 62. The processed substrate 62 is held from the rear surface since a holding mechanism, such as a clamp jig, cannot be provided on the front surface of the processed substrate 62 exposed to the ion beam.

In a case where the processed substrate 62 is a glass plate, often the plate is square in shape with a side length of 1 m and a plate thickness of 0.5 mm, making it susceptible to distortion. Furthermore, the front surface of the glass plate is subjected to processing for micro circuit elements, etc., and, to avoid adherence of fine dust and particles, cannot come in contact with clamps or the like from the processed surface side. In consequence, as illustrated in FIG. 2, the processed substrate 62 is preferably inclined and held by gravity from the rear surface.

The Faraday cup 64 is provided to the downstream side of the disposed position of the processed substrate 62. The Faraday cup 64 is provided in plurality across a range that is wider than the beam width of the ion beam 24, in the direction of the beam width. The configuration is designed so that the length in the beam thickness direction of the surface of each of the Faraday cups 64 that receives the ion beam 24 is longer than the beam thickness of the ion beam 24, and the total value of the current density distributions of the ion beam 24 along the beam thickness direction is measured at once. The plurality of Faraday cup 64 is arranged adjacently in the beam width direction, and thus the total value of the current densities is separately measured at each position of the Faraday cups 64 in the beam width direction.

The Faraday cup 64 comprises a cup section that receives ion particles, and a secondary electron capturing mechanism (not shown). The secondary electron capturing mechanism is a capturing mechanism that prevents the secondary electrons produced upon impact of the ion particles on the inner surface of the Faraday cup 64 from leaking outside the Faraday cup 64. Leakage of the secondary electrons to the outside of the Faraday cup 64 results in density current measurement errors. The secondary electron capturing mechanism may employ a capturing function that uses a magnetic field, or a capturing function that uses an electric field.

The number of Faraday cups 64 may be increased as necessary and may be increased in a case where measurement accuracy is to be enhanced; the number is independent of the installed number of unit lens elements of the lens element 40. To accurately measure a current density variance equivalent to a small percentage, the number of the installed Faraday cups 64 is preferably around 100. Accurate regulation of the ion beam 24, however, can be achieved from current density distribution even when the number is around 20 to 40.

In addition to the pattern in which a plurality of the Faraday cups 64 is arranged as shown in FIGS. 1 and 2, a single Faraday cup may be moved so that it crosses from edge to edge in the beam width direction of the ion beam 24 and measures the position and the current density together. This method makes it possible to take accurate measurements using just one Faraday cup.

While the processing portion 60 of this embodiment moves the processed substrate 62 vertically to perform ion implantation, the present invention also allows methods wherein the processed substrate is moved in an arc shape or is mounted on a disk and rotated for ion beam irradiation. In a case of movement in an arc shape or rotation, the turning radius differs by location, and thus each position of the processed substrate moves with respect to the ion beam. As a result, to perform uniform ion implantation, the current density distribution of the ion beam needs to be regulated taking into consideration the movement of each position of the processed substrate.

Note that each of the Faraday cups 64 shown in FIGS. 1 and 2 is connected to a measurement module 82 inside the control portion 80, and the total value of the current densities measured by each of the Faraday cups 64 is sent to the measurement module 82.

The control portion 80 comprises a computer, which comprises the measurement module 82 and a control module 84, that implements the method of the present invention by executing a program, and a power supply control portion 86. The control signal outputted from the control portion 80 forms the current of the unit lens elements supplied to the electromagnets 44 of each of the unit lens elements via a power supply driving portion 88.

The computer formed by the measurement module 82 and the control module 84 comprises a memory 85, the CPU 86 that substantially performs the computing of the measurement module 82 and the control module 84, and an I/O 87.

Figure 3A:
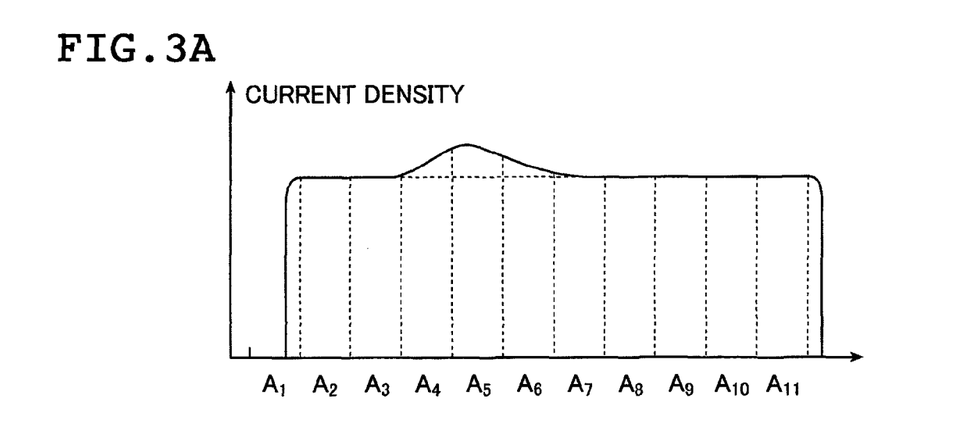
FIG. 3A is an explanatory view illustrating an example of the current density distribution of an ion beam obtained by the ion implanter illustrated in FIG. 1, and FIG. 3B and FIG. 3C are explanatory views for explaining the change in current density of an ion beam when regulation is performed using a magnetic field.

The measurement module 82 is a section that calculates the current density distribution using data sent from each of the Faraday cups 64. For example, as shown in FIG. 3A, a non-uniform current density distribution is obtained. This non-uniform current density distribution is divided into sections $A_1$ to $A_{11}$ in accordance with the range of the magnetic field to be created by the lens element 40 in the beam width direction, as illustrated in FIG. 3A. Here, the sections $A_4$ to $A_6$ greatly deviate from the target uniform distribution.

The control module 84 is a section that sets the intensity of the magnetic field to be created by the electromagnets 44 of each of the unit lens elements of the lens element 40, based on the obtained current density distribution. In response to the difference deviation from the current density distribution target obtained by the measurement module 82, the control module 84 extracts from the sections $A_1$ to $A_{11}$ the section that is to serve as the center of regulation, determines the regulation intensity of the magnetic field with a central focus on the electromagnet 44 of the unit lens element corresponding to this section (corresponding unit lens element), and sets the intensity of the magnetic field accordingly. The specific procedure will be described later. Information on the set intensity is then sent to the power supply driving portion 88 as a control signal.

The power supply driving portion 88 is a section that determines the current value supplied to each of the electromagnets 44 of the lens element 40 based on the sent control signal, and supplies the current.

The ion implantation method of such the ion implanter 10 will now be described. First, the ion beam 24 generated by the ion source 22 is shaped by the mass separation magnet 32 into the ribbon ion beam 24 that expands in the beam width direction, subsequently passed through the slit 50 as the ion beam 24 comprising ion particles of a predetermined mass and charge, and then supplied to the processing portion 60. At this time, the ion beam 24 is regulated by the lens element 40 using a preset or initially set magnetic field intensity. The processing portion 60 then performs ion implantation on the processed substrate 62, measuring the current density of the ion beam 24 using the Faraday cups 64 prior to ion implantation (step S10).

The measured current density data is sent to the measurement module 82, then the current density distribution is determined. This current density distribution is stored in the memory 85 and called from the control module 84, then the difference between the current density distribution and the target distribution stored in advance in the memory 85 is determined and the distribution of the difference deviation is calculated. The position within the distribution of the difference deviation having the maximum gradient of the difference deviation (the position to be regulated) is extracted as the reference position from within the sections $A_1$ to $A_{11}$ corresponding to each of the unit lens elements of the lens element 40 illustrated in FIG. 3A (step S20). In the case of the distribution shown in FIG. 3A, the section $A_4$ is this reference position.

Figure 3B:
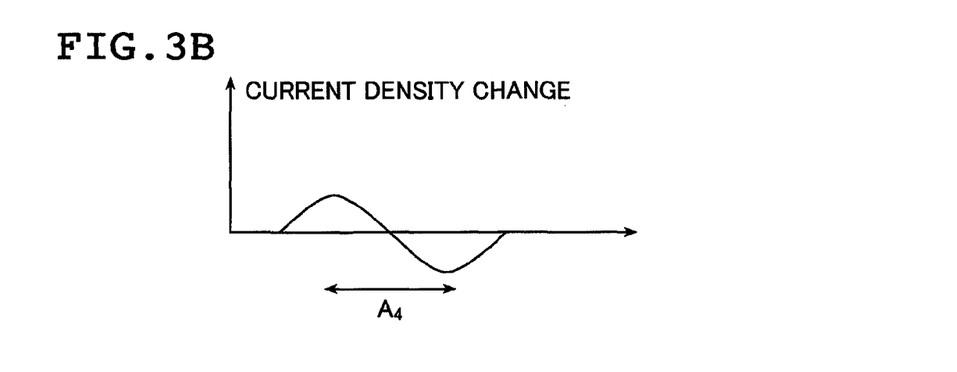

Next, the regulation intensity $I_a$ of the magnetic field to be created by the corresponding unit lens element corresponding to the section $A_4$, which is the determined reference position, is determined (step S30). Specifically, the regulation intensity $I_a$ of the magnetic field that will create a current density that will offset this slope is determined in accordance with the above-described maximum slope of the section $A_4$ of the current density distribution. The positive ion particles of the ion beam 24 that move orthogonal to the magnetic field generated by the electromagnet 44 receive a force in the direction orthogonal to the vector oriented toward the magnetic field and the vector of the movement direction of the ion particles in the magnetic field, that is, in the width direction of the ion beam 24, and bend, causing the magnetic field generated by the electromagnet 44 to create a sloped distribution in which the current density increases on one side and decreases on the other side of the section $A_4$. That is, the regulation intensity $I_a$ of the magnetic field to be created by the electromagnet 44 of the corresponding unit lens element corresponding to the section $A_4$ is determined so that the value offsets the maximum slope of the current density in FIG. 3A, causing a change in the current density distribution, such as shown in FIG. 3B.

While, in this embodiment, the regulation intensity $I_a$ of the magnetic field is determined so that the value offsets the maximum slope of the current density, the present invention also allows use of a sufficiently small predetermined value, such as a value that is determined in accordance with the target energy of the ion beam, for example.

Figure 3C:
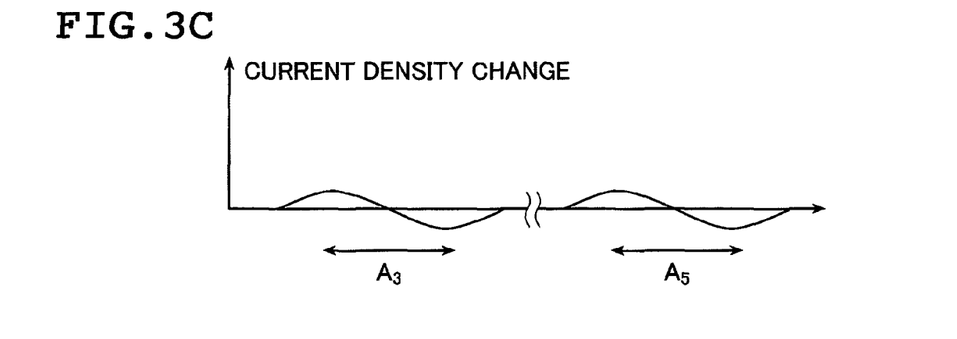

Next, a regulation intensity $I_b$ of the magnetic field to be generated for the electromagnets 44 of unit lens elements adjacent to the corresponding unit lens element corresponding to the section $A_4$, which is the reference position, is determined (step S40). The electromagnets 44 of the adjacent unit lens elements are also subject to control since a distribution in which the current density increases on one side and decreases on the other side is created as previously described, affecting the electromagnets 44 and changing the current density in the region surrounding the reference position as well. Thus, the regulation intensity $I_b$ of the magnetic fields to be generated by the electromagnets 44 of the unit lens elements adjacent to the reference position is determined as a value equivalent to the regulation intensity $I_a$ of the above-described magnetic field multiplied by a fixed ratio. The magnetic field of this regulation intensity $I_b$ exhibits a change in current density such as illustrated in FIG. 3C, making it possible for the magnetic field of the regulation intensity $I_a$ of the section $A_4$ to suppress the effect that the current density has on the ranges of the sections $A_3$ and $A_5$.

Furthermore, the value obtained when the magnetic field of the regulation intensity $I_b$ of the sections $A_3$ and $A_5$ is multiplied by the above-described fixed ratio is determined as the regulation intensity of the electromagnets 44 of the unit lens elements corresponding to the sections $A_2$ and $A_6$. This magnetic field is capable of suppressing the current density effect that the magnetic fields of sections $A_3$ and $A_5$ have on the sections $A_2$ and $A_6$.

In this manner, the position corresponding to the section $A_4$ is defined as the reference position, and the regulated intensities of the magnetic fields of adjacent sections away from the reference position are determined as a product of a fixed ratio. Note that the above-described fixed ratio is 1 or less, and preferably a fixed value within a range of 0.3 to 0.6. Each of the regulated intensities thus determined are added to the intensity of the magnetic field of the lens element 40 presently set, and the sum result is set as the intensity of the magnetic field to be applied to the ion beam 24 to be regulated.

The set intensity of the magnetic field of each of the unit lens elements is supplied to the power supply driving portion 88 as a control signal.

The power supply driving portion 88 sets a current value to be introduced to each of the electromagnets 44 in accordance with the control signal, and introduces current to each of the electromagnets 44. With this arrangement, a magnetic field of the intensity set for each of the electromagnets 44 is generated, thereby regulating the current density distribution of the ion beam 24 (step S50).

Furthermore, the current density of the current density regulated ion beam 24 is measured by the Faraday cups 64 (step S60).

As a result, in a case where the control module 84 assesses that the difference between the measured current density distribution and the target distribution is within the permissible range and the measured current density distribution substantially matches the target distribution (Yes in step S70), regulation of the current density distribution of the ion beam 24 ends. On the other hand, in a case where the control module 84 assesses that the measured current density distribution does not match the target distribution (No in step S70), regulation of the current density distribution of the ion beam 24 is performed once again. That is, the flow returns to step S20. In this manner, the steps S20 to S60 are repeatedly performed until the control module 84 assesses that the measured current density distribution substantially matches the target distribution in step S70. At this time, it is preferable to verify by measurement the current density distribution regulation capacity of the magnetic field prior to the series of regulation.

Thus, according to this embodiment, the non-uniformity of the current density of the ion beam 24 is regulated not by individually regulating the electromagnets 44 of the unit lens elements, but by determining the value obtained by multiplying the regulation intensity of the magnetic field of the electromagnet of the adjacent unit lens element by a fixed ratio as the regulation intensity of the magnetic field, adding this regulation intensity to the intensity of the lens element 40 presently set, setting the intensity of the magnetic field accordingly, and regulating the plurality of unit lens elements as a whole, thereby achieving efficient regulation. Moreover, the regulation intensity of each magnetic field is determined by multiplying the regulation intensity of the center magnetic field by a fixed ratio, thereby achieving good robustness as well.

Figure 4:
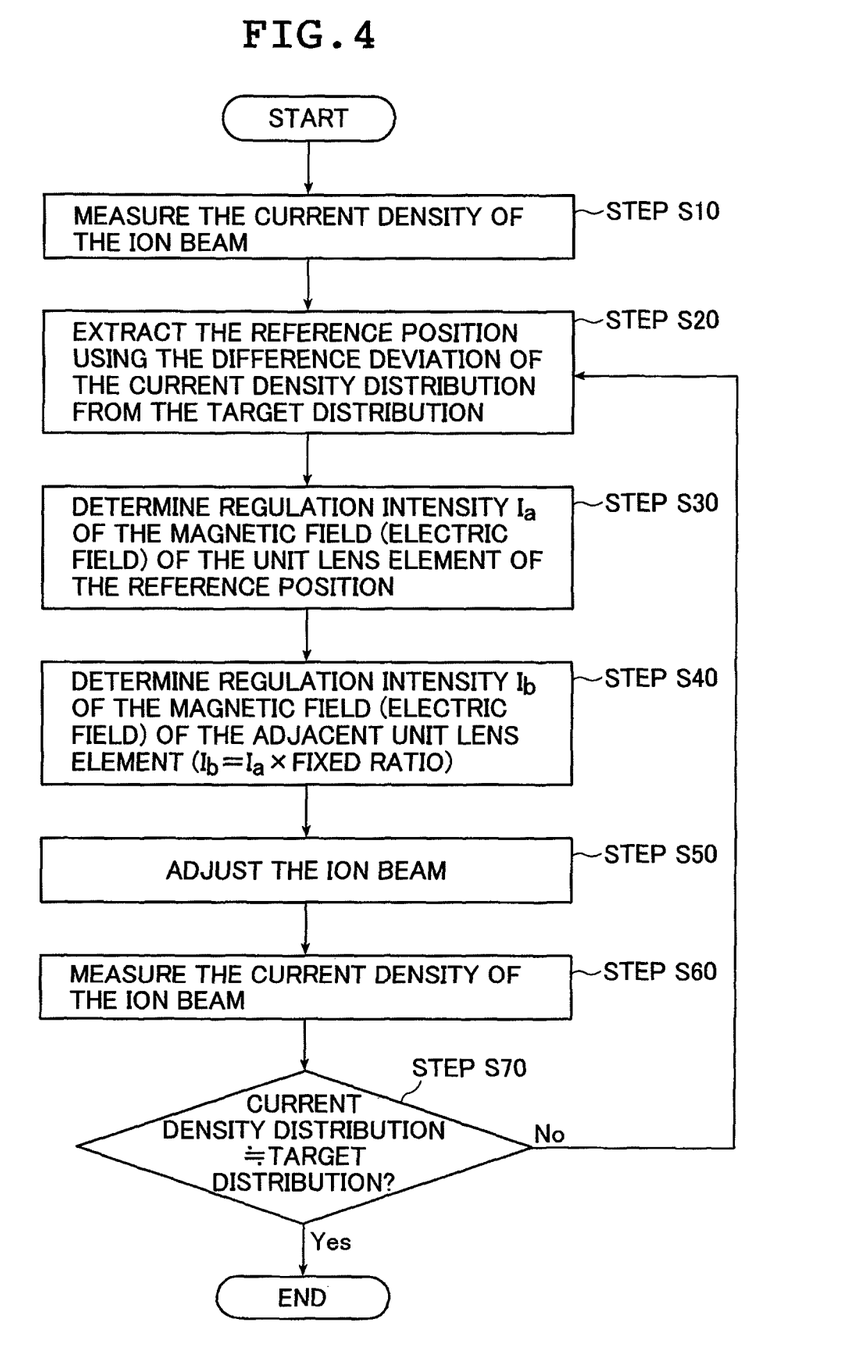
FIG. 4 is a flowchart indicating an embodiment of the ion implantation method of the present invention.
Figure 5:
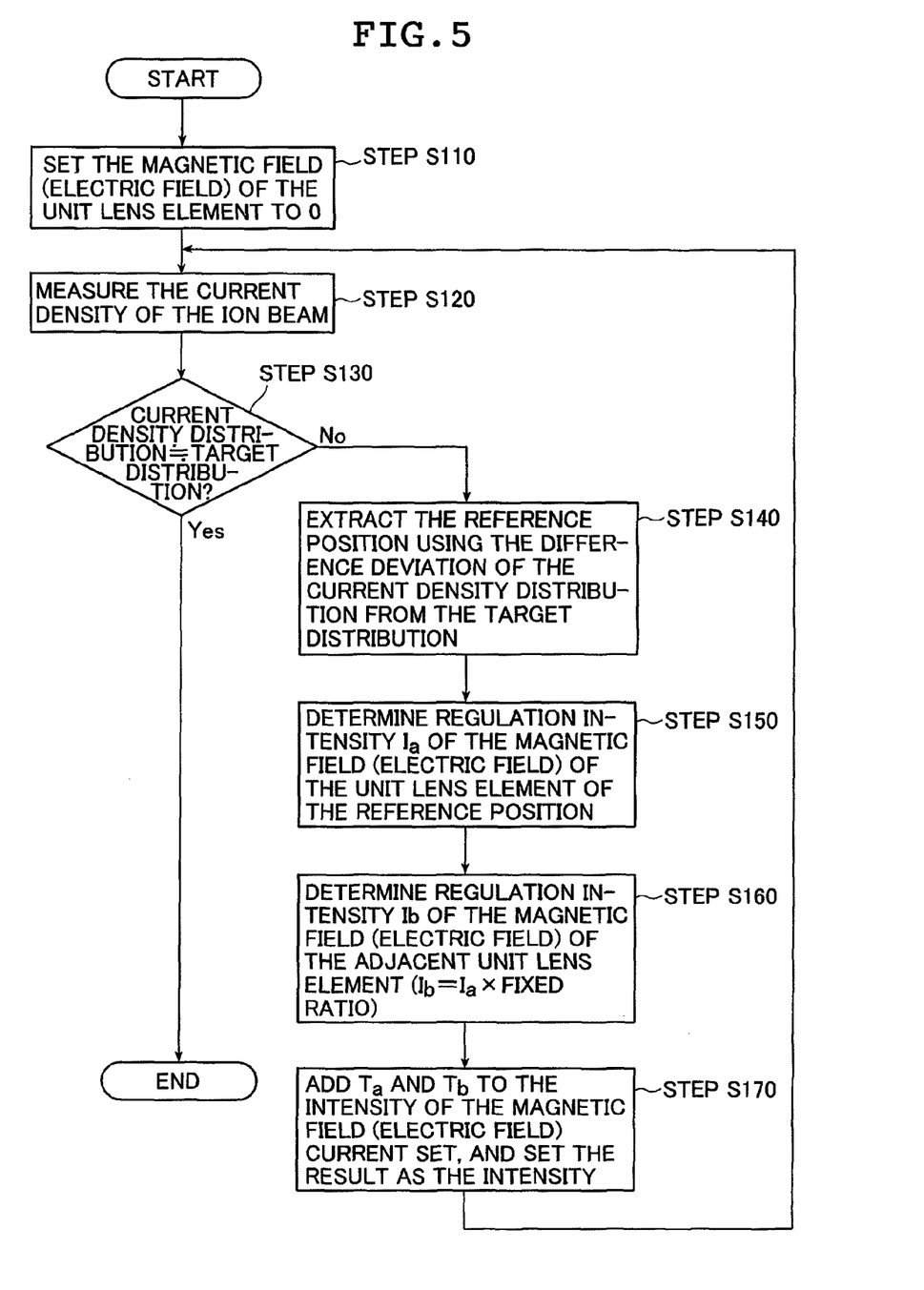
FIG. 5 is a flowchart indicating another embodiment of the ion implantation method of the present invention.

Note that, according to the present invention, the current density distribution of the ion beam may be regulated in accordance with the flow shown in FIG. 5 rather than that shown in FIG. 4 as well.

That is, the initial intensity settings of the lens element 40 are all set to zero (step S110). Next, the distribution of the current density of the ion beam is measured (step S120). Subsequently, the control module 84 assesses whether or not the measured current density distribution substantially matches the target distribution (step S120). In a case where the measured current density distribution substantially matches the target distribution, the startup processing of the ion implanter 10 ends and ion implantation processing proceeds. On the other hand, in a case where the measured current density distribution does not substantially match the target distribution, the flow proceeds to step S140 to step S160. Step S140 to step S160 have the same content as steps S20 to S40 indicated in FIG. 4. Subsequently, the regulation intensity is added to the intensity set for the lens element 40, and the sum value is reset as the intensity of the lens element 40. Since the initial intensity is set to zero, the regulation intensity itself is set when the intensity is reset for the first time. Thus, steps S120 to S170 are repeated until the value is affirmed in step S130.

While the lens element 40 of this embodiment regulates the current density distribution of the ion beam 24 using a magnetic field, the current density distribution may be regulated using an electric field.

Figure 6A:
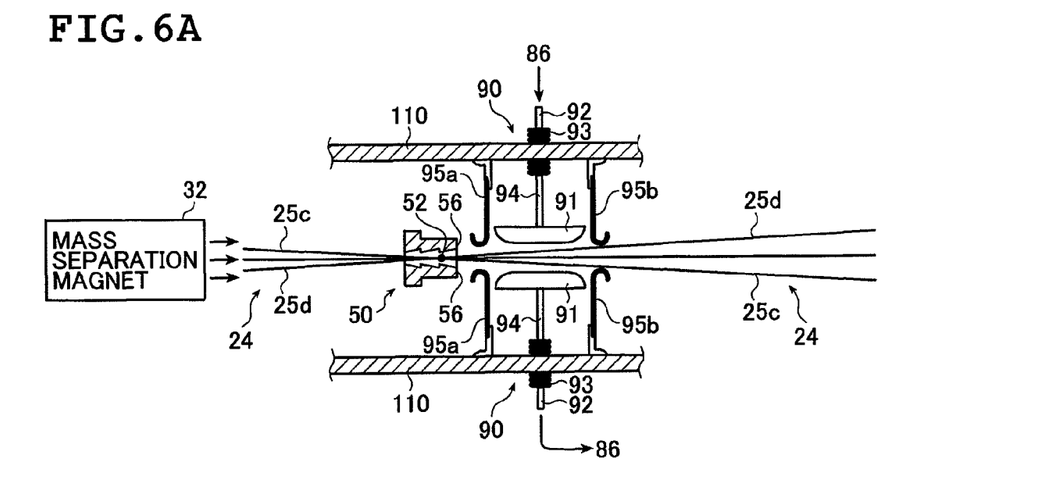
FIG. 6A is a cross-sectional view schematically illustrating the configuration of a lens element of another embodiment used in place of the lens element used in the ion implanter illustrated in FIG. 1.
Figure 6B:
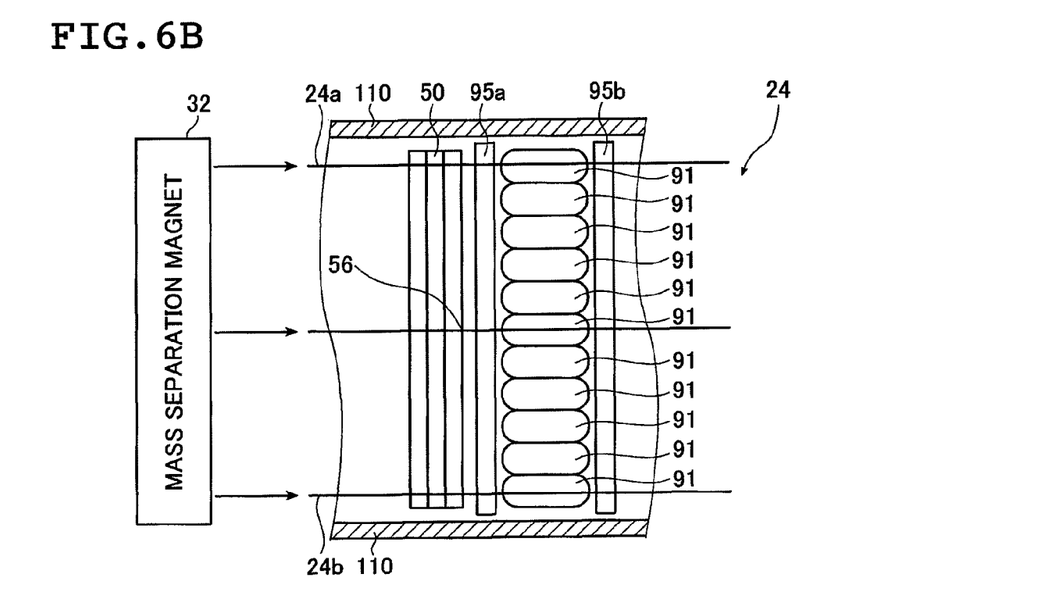
FIG. 6B is a schematic cross-sectional view for explaining the interior of the lens element illustrated in FIG. 6A.

FIG. 6A is a schematic front cross-sectional view of a lens element 90 used in place of the lens element 40, and FIG. 6B is a cross-sectional view schematically illustrating a cross-section taken 90 degrees from that of FIG. 6A.

The lens element 90 is provided to the downstream side of the convergence position 52 of the ion beam 24.

While, according to this embodiment, the lens element 90 is provided so that the current density distribution of the ion beam is regulated in the region near the convergence position 52 of the ion beam where the thickness is thinner than the beam thickness of the ion beam 24 that passes through the mass separation magnet 32 positioned on the upstream side, the position of the lens element 90 is not particularly limited in the present invention.

According to the embodiment shown in FIG. 6A and FIG. 6B, the lens element 90 is provided so that it is adjacent to the position of the separation slit 50.

In the lens element 90, a terminal 92 on the outside and a support 94 on the inside of a vacuum housing 110 are connected via an insulated feeder terminal 93, and an electrode 91 is provided on the front end side of the support 94. The terminal 92 is connected to the power supply driving portion 88 of the control portion 80 shown in FIG. 1.

As understood from FIG. 6A and FIG. 6B, a set of the electrode 91, the terminal 92, the insulated terminal 93, and the support 94 is arranged in a plurality along the beam width direction from the edge 25a to the edge 25b of the ion beam 24. To correspond with this set, a set of the electrode 91, the terminal 92, the insulated terminal 93, and the support 94 having the same structure is arranged in a plurality in the beam width direction at a symmetrical position on the opposite side across the ion beam 24, thereby forming unit lens elements of a plurality of sets.

The number of unit lens elements is about 10 to 20, similar to the number of unit lens elements of the aforementioned lens element 40.

The same homopolar DC voltage is applied to the electrode 91 of the lens element 90, creating an electric field between the electrodes 91 that is axisymmetric to the center plane in the beam thickness direction of the ion beam 24. For example, the ion beam current density is regulated by applying positive voltage to the electrode 91, utilizing the bending of the ion beam 24 that occurs at both sides of the electric field as the beam attempts to avoid the electric field.

As illustrated in FIG. 6A and FIG. 6B, shield electrodes 95a and 95b are provided from the vacuum housing 110, on the upstream side and the downstream side of the lens element 90. The shield electrodes 95a and 95b are provided in positions symmetrical with respect to the electrode 91, and shield the electric field so that the electric field to be created by the lens element 90 does not affect the ion beam 24 outside the region of the lens element 90.

The shape of an end face 56 on the downstream side of the separation slit 50 may be processed into the same shape as the shield electrode 95a and extended to the inner surface of the vacuum housing 110 to provide a function similar to that of the shield electrode 95a. In such a case, the shield electrode 95b is preferably provided in a position that is symmetrical to the position of the end face 56 of the separation slit 50 with the electrode 91 at the center.

In such the lens element 90, the current density distribution of the ion beam 24 is regulated by a method similar to that of the lens element 40 that regulates the current density distribution using a magnetic field. The specific processing method is performed using the flow shown in FIG. 4.

With the lens element 90 that regulates the current density using an electric field, the difference deviation of the current density distribution from the target distribution is determined, and the section having a maximum deviation position in this difference deviation is defined as the reference position. The regulation intensity $I_a$ of the electric field that is to create a current density that offsets this difference deviation is determined in accordance with the difference deviation of this reference position. On the other hand, in the case of the aforementioned lens element 40, the reference position used is the position of the section having the maximum slope position of the difference deviation, and the regulation intensity $I_a$ of the magnetic field that is to create a current density that offsets this maximum slope is determined in accordance with the maximum slope of the reference position.

With use of the electric field, the ion beam 24 bends on both sides to avoid the electric field. As a result, the current density of the ion beam 24 to be created by the electric field greatly changes so that the current density at the position where the electric field is generated decreases, symmetrically changing the current density so that it increases at both sides thereof.

Figure 7A:
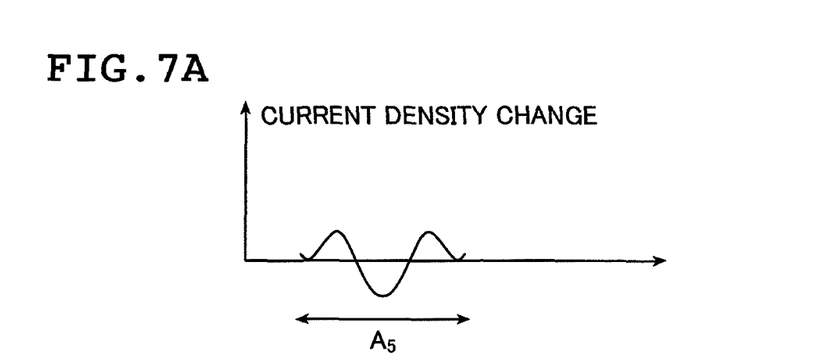
FIG. 7A and FIG. 7B are explanatory views for explaining the change in current density of the ion beam when regulation is performed using an electric field.

In the case of the current density distribution shown in FIG. 3A, the difference deviation from the target distribution is largest in the section $A_5$, and thus the regulation intensity $I_a$ of the electric field is determined so that the value eliminates the maximum difference deviation of this section $A_5$. With this arrangement, a change in current density distribution such as illustrated in FIG. 7A is produced.

Furthermore, the value obtained by multiplying the regulation intensity $I_a$ by a fixed ratio is defined as the regulation intensity $I_b$ of the electric fields to be created in sections A4 and A6, this regulation intensity $I_b$ is added to the current intensity set for the lens element, and the lens element intensity is set accordingly.

Figure 7B:
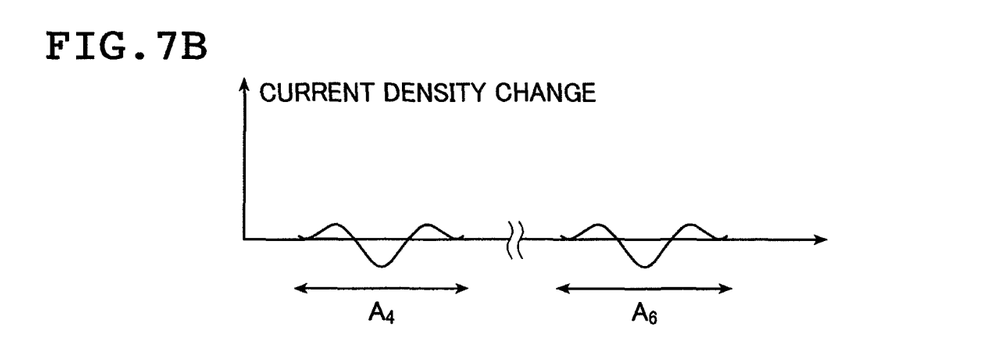

This electric field causes a current density change, such as that illustrated in FIG. 7B, to occur, making it possible for the electric field of the section $A_5$ to suppress the current density effect on the adjacent sections $A_4$ and $A_6$.

In this manner, the electric field of the corresponding unit lens element corresponding to the section $A_5$ is established as the reference position, and the value obtained by multiplying the regulation intensity of the electric field at the reference position by a fixed ratio is determined as the regulation intensity of the electric fields of the adjacent sections away from the reference position. Note that the above-described fixed ratio is 1 or less, and preferably a fixed value within a range of 0.3 to 0.6.

The set intensity of the electric field of the electrode 91 of each of the unit lens elements is supplied to the power supply driving portion 88 as a control signal.

The power supply driving portion 88 sets a voltage value to be applied to each of the electrodes 91 in accordance with the control signal, and applies voltage to each of the electrodes 91. With this arrangement, an electric field of the intensity set for each of the electrodes 91 is generated, thereby regulating the current density distribution of the ion beam 24.

Furthermore, the Faraday cups 64 measure the current density of the current density regulated ion beam 24.

As a result, in a case where the control module 84 assesses that the difference between the measured current density distribution and the target distribution is within the permissible range and the measured current density distribution substantially matches the target distribution, regulation of the current density distribution of the ion beam 24 ends. On the other hand, in a case where the control module 84 assesses that the measured current density distribution does not match the target distribution, regulation of the current density distribution of the ion beam 24 is performed once again. In this manner, the current density distribution is repeatedly regulated until the control module 84 assesses that the measured current density distribution substantially matches the target distribution. At this time, it is preferable to verify by measurement the current density distribution regulation capacity of the electric field prior to the series of regulation.

The intensity of the magnetic field or electric field is set in the above-described ion implantation method by using the computer of the control portion 80 and executing the following program.

That is, the program comprises the steps of: calculating in the CPU 86 of the computer the current density distribution from the measured current density data of the ion beam 24 regulated by the magnetic field or electric field of each unit lens element, and storing the distribution in the memory 85;

setting in the CPU 86 the corresponding position of the unit lens element of the plurality of unit lens elements that corresponds to the position where the calculated current density distribution is to be regulated, calculating in the CPU 86 the regulation intensity of the magnetic field or electric field to be created by this corresponding unit lens element from the measured current density distribution, calculating in the CPU 86 for a magnetic field or electric field to be created by a unit lens element adjacent to the corresponding unit lens element a value obtained by multiplying the calculated regulation intensity by a fixed ratio as the regulation intensity of the magnetic field or electric field, and resetting in the CPU 86 the sum of the regulated intensities thus calculated and the intensity of the magnetic field or electric field presently set in each unit lens element as the intensity of the magnetic field or electric field; and creating a control signal in the CPU 86 for applying the reset intensity to the electric field or magnetic field of the plurality of lens elements to regulate the current density distribution of the ion beam 24.

Additionally, the program may have the following steps. That is, the program may comprise the steps of: calculating in the CPU 86 the current density distribution from the measured current density data of the ion beam, and storing the distribution in the memory 85;

setting in the CPU 86 the corresponding unit lens element of the plurality of unit lens elements that corresponds to the position where the calculated current density distribution is to be regulated, calculating in the CPU 86 the regulation intensity of the magnetic field or electric field to be created by this corresponding unit lens element from the measured current density distribution, calculating in the CPU 86 for a magnetic field or electric field to be created by a unit lens element adjacent to the corresponding unit lens element a value obtained by multiplying the calculated regulation intensity by a fixed ratio as the regulation intensity of the magnetic field or electric field, and resetting in the CPU 86 the sum of these regulated intensities thus determined and the intensity of the magnetic field or electric field presently set in each unit lens element as the intensity of the magnetic field or electric field;

calculating by simulation in the CPU 86 the current density distribution of the ion beam regulated using the reset intensity;

repeatedly resetting the intensity of the magnetic field or electric field and performing simulation until the current density distribution obtained by simulation substantially matches the target distribution; and creating in the CPU 86 a control signal that applies the intensity when the current intensity distribution obtained by simulation substantially matches the target distribution to the electric field or magnetic field of the plurality of unit lens elements to regulate the current density distribution of the ion beam.

Such a program as described above is preferably coded and stored on a computer-readable recording medium.

Thus, according to the present invention, it is possible to set an intensity of a magnetic field or an electric field to be created by the lens element 40 or the lens element 90 in accordance with measurement results of the current density distribution of the ion beam 24 and, at this time, determine the reference position to be regulated, determine for a magnetic field or electric field of a unit lens element adjacent to this reference position a value obtained by multiplying the regulation intensity of the magnetic field or electric field of the reference position by a fixed ratio as the regulation intensity of the magnetic field or electric field, and set the intensity accordingly, thereby efficiently regulating the current density distribution of the ion beam to the target distribution.

While the above has described in detail the inventive ion implanter, ion implantation method, program, and computer-readable recording medium on which this program is coded and stored, the present invention is not limited to the above-described embodiments, and various modifications and changes may be made without departing from the spirit and scope of the present invention.

The invention claimed is:

1. An ion implanter that irradiates on a target substrate to be processed a ribbon ion beam having a beam width that is wider than a lateral width of the target substrate to be processed and performs ion implantation on the target substrate to be processed, comprising:
    a beam shaping portion that comprises an ion source that generates an ion beam and shapes the generated ion beam into the ribbon ion beam;
    a processing portion that irradiates said ribbon ion beam onto the target substrate to be processed;
    a beam regulating portion that, in order to regulate a current density distribution of said ribbon ion beam in which a total value of current densities in a direction of the beam thickness of said ribbon ion beam is represented by a distribution in a direction of the beam width, arranges unit lens elements along the direction of the beam width of said ribbon ion beam, and regulates and sets an intensity of a magnetic field or electric field to be created by each unit lens element; and
    a beam controlling portion comprising a measuring portion that measures the current density distribution of said ribbon ion beam regulated by said beam regulating portion, and a setting portion that resets the intensity of the magnetic field or electric field by determining a regulation intensity of the magnetic field or electric field to be created by said unit lens element to be regulated by said beam regulating portion in accordance with the measurement results, and adding said regulation intensity thus determined to the intensity of the magnetic field or electric field presently set in said beam regulating portion,
    wherein said setting portion determines the regulation intensity of the magnetic field or electric field to be created by a corresponding unit lens element of said unit lens elements that corresponds to a position where said current density distribution thus measured is to be regulated from the current density distribution measured by said measuring portion, determines for the magnetic field or electric field to be created by a unit lens element adjacent to said corresponding unit lens element a value obtained by multiplying said regulation intensity thus determined by a fixed ratio as the regulation intensity of the magnetic field or electric field, and resets the intensity of the magnetic field or electric field using said regulation intensity thus determined.

2. The ion implanter according to claim 1, wherein:
    said beam regulating portion regulates the electric field to be created by said unit lens element, said position where the current density distribution is to be regulated is a position where a difference between the measured current density distribution and a predetermined distribution is largest, and said fixed ratio is 1 or less; and
    said beam regulating portion determines the value obtained by multiplying the regulation intensity of the electric field of said corresponding unit lens element thus set by said fixed ratio as the regulation intensity of the electric field for the unit lens element adjacent to said corresponding unit lens element corresponding to the position where said difference is largest.

3. The ion implanter according to claim 1, wherein:
    said beam regulating portion regulates the magnetic field to be created by said unit lens element, said position where the current density distribution is to be regulated is a position where a gradient of difference is largest in a distribution of differences between the measured current density distribution and a predetermined distribution, and said fixed ratio is 1 or less; and
    said beam regulating portion determines the value obtained by multiplying the regulation intensity of the magnetic field of said corresponding unit lens element thus set by said fixed ratio as the regulation intensity of the magnetic field for the unit lens element adjacent to said corresponding unit lens element corresponding to the position where said gradient is largest.

4. The ion implanter according to claim 1, wherein said fixed ratio ranges from 0.3 to 0.6.

5. An ion implantation method that uses said ion implanter according to claim 1 that irradiates on said target substrate to be processed said ribbon ion beam having a beam width that is wider than a lateral width of this target substrate to be processed and performs ion implantation on the target substrate to be processed,
    said ion implantation method comprising the steps of:
    when the ribbon ion beam is to be irradiated by said processing portion on the target substrate to be processed to perform the ion implantation,
    measuring the current density distribution of the ribbon ion beam regulated by said beam regulating portion by the magnetic field or electric field of each of said unit lens elements with said measuring portion of said beam controlling portion;
    resetting the intensity of the magnetic field or electric field with said setting portion of said beam controlling portion by determining a corresponding unit lens element of said unit lens elements that corresponds to a position where said current density distribution thus measured is to be regulated, determining a regulation intensity of the magnetic field or electric field to be created by said corresponding unit lens element from said current density distribution thus measured, determining, as the regulation intensity of the magnetic field or electric field, a value obtained by multiplying said intensity thus set by a fixed ratio for the magnetic field or electric field to be created by said unit lens element adjacent to said corresponding unit lens element, and adding said regulation intensity thus determined to the intensity of the magnetic field or electric field presently set in each of said unit lens elements; and applying the reset intensity to the electric field or magnetic field of said unit lens elements with said beam regulating portion to regulate the current density distribution of said ribbon ion beam.

6. A computer-readable recording medium on which is coded and stored a computer-executable program which sets an intensity of a magnetic field or electric field in said ion implanter according to claim 1 that irradiates on a target substrate to be processed a ribbon ion beam having a beam width that is wider than a lateral width of the target substrate to be processed and performs ion implantation on the target substrate to be processed, in order to cause said magnetic field or electric field to act on said ribbon ion beam and regulate a current density distribution of said ribbon ion beam, wherein computing means of a computer operates said setting portion of said beam controlling portion of said ion implanter, said program comprising the procedures of:

when the ribbon ion beam regulated by said beam regulating portion by the magnetic field or electric field of each of said unit lens elements is irradiated by said processing portion on the target substrate to be processed to perform the ion implantation, calculating the current density distribution of the ribbon ion beam from measured data of the current density by said measuring portion of said beam controlling portion in said computing means of the computer, and storing the calculated current density distribution of the ribbon ion beam in storing means of the computer;

determining in said computing means a corresponding unit lens element of said unit lens elements that corresponds to a position where said current density distribution thus calculated is to be regulated, calculating in said computing means a regulation intensity of the magnetic field or electric field to be created by the corresponding unit lens element from said current density distribution thus measured, calculating in said computing means for the magnetic field or electric field to be created by a unit lens element adjacent to said corresponding unit lens element a value obtained by multiplying said regulation intensity thus calculated by a fixed ratio as the regulation intensity of said magnetic field or electric field, and resetting in said computing means a sum of these regulated intensities thus calculated and the intensity of the magnetic field or electric field presently set in each of said unit lens elements as the intensity of the magnetic field or electric field; and creating in said computing means a control signal that applies the reset intensity to the electric field or magnetic field of said unit lens elements to regulate the current density distribution of said ribbon ion beam.

7. A computer-readable recording medium on which is coded and stored a computer-executable program which sets an intensity of a magnetic field or electric field in an said ion implanter according to claim 1 that irradiates on a target substrate to be processed a ribbon ion beam having a beam width that is wider than a lateral width of the target substrate to be processed and performs ion implantation on the target substrate to be processed, in order to cause said magnetic field or electric field to act on said ribbon ion beam and regulate a current density distribution of said ribbon ion beam, wherein computing means of a computer operates said setting portion of said beam controlling portion of said ion implanter, said program comprising the procedures of:

when the ribbon ion beam regulated by said beam regulating portion by the magnetic field or electric field of each of said unit lens elements is irradiated by said processing portion on the target substrate to be processed to perform the ion implantation, calculating the current density distribution of the ribbon ion beam from measured data of the current density by said measuring portion of said beam controlling portion in said computing means of the computer, and storing the calculated current density distribution of the ribbon ion beam in storing means of the computer;

determining in said computing means a corresponding unit lens element of said unit lens elements that corresponds to a position where said current density distribution thus calculated is to be regulated, calculating in said computing means a regulation intensity of the magnetic field or electric field to be created by the corresponding unit lens element from said current density distribution thus measured, calculating in said computing means for the magnetic field or electric field to be created by a unit lens element adjacent to said corresponding unit lens element a value obtained by multiplying said regulation intensity thus calculated by a fixed ratio as a regulation intensity of said magnetic field or electric field, and resetting in said computing means a sum of these regulated intensities thus calculated and the intensity of the magnetic field or electric field presently set in each of said unit lens elements as the intensity of the magnetic field or electric field;

calculating by simulation in said computing means the current density distribution of the ribbon ion beam regulated using the reset intensity;

repeatedly resetting the intensity of the magnetic field or electric field and performing said simulation in said computing means until the current density distribution obtained by said simulation substantially matches the target distribution; and creating in said computing means a control signal that applies said intensity when the current density distribution obtained from said simulation substantially matches said target distribution to the electric field or magnetic field of said unit lens elements to regulate the current density distribution of said ribbon ion beam.

* * * * *